United States Patent
Koseki

(10) Patent No.: US 9,340,024 B2
(45) Date of Patent: May 17, 2016

(54) METHOD OF MANUFACTURING A LIQUID JET HEAD

(75) Inventor: Osamu Koseki, Chiba (JP)

(73) Assignee: SII PRINTEK INC. (JP)

( * ) Notice: Subject to any disclaimer, the term of this patent is extended or adjusted under 35 U.S.C. 154(b) by 956 days.

(21) Appl. No.: 13/432,093

(22) Filed: Mar. 28, 2012

(65) Prior Publication Data

US 2012/0246932 A1   Oct. 4, 2012

(30) Foreign Application Priority Data

Apr. 4, 2011   (JP) .................. 2011-083054

(51) Int. Cl.
*B41J 2/16* (2006.01)
*H05K 3/12* (2006.01)

(52) U.S. Cl.
CPC .............. *B41J 2/1609* (2013.01); *B41J 2/1612* (2013.01); *B41J 2/1623* (2013.01); *B41J 2/1632* (2013.01); *H05K 3/1258* (2013.01); *Y10T 29/42* (2015.01); *Y10T 29/49401* (2015.01)

(58) Field of Classification Search
CPC ...... B41J 2/1609; B41J 2/1612; B41J 2/1623; B41J 2/1632; Y10T 29/42; Y10T 29/49401; H05K 3/1258
See application file for complete search history.

(56) References Cited

U.S. PATENT DOCUMENTS

| | | | |
|---|---|---|---|
| 5,193,256 A | 3/1993 | Ochiai et al. | |
| 5,619,235 A | 4/1997 | Suzuki | |
| 6,560,833 B2* | 5/2003 | Nishi et al. | B41J 2/1609 |
| 6,651,335 B2* | 11/2003 | Akanabe et al. | B41J 2/1609 |
| 2003/0011660 A1 | 1/2003 | Nishi et al. | |
| 2003/0076382 A1 | 4/2003 | Suzuki | |
| 2004/0070643 A1 | 4/2004 | Kubota et al. | |
| 2004/0130602 A1* | 7/2004 | Watanabe | B41J 2/1632 |
| 2007/0259293 A1* | 11/2007 | Shin et al. | H05K 3/1258 |
| 2010/0177133 A1 | 7/2010 | Makishima | |

FOREIGN PATENT DOCUMENTS

| | | | |
|---|---|---|---|
| EP | 0552814 | | 7/1993 |
| EP | 0615845 | | 9/1994 |
| EP | 9615845 | | 9/1994 |
| JP | 564893 | | 3/1993 |
| JP | 09048132 | | 2/1997 |
| JP | 10315469 | | 12/1998 |
| JP | 2000263787 | | 9/2000 |
| JP | 200196743 | | 4/2001 |
| JP | 2003127371 | | 5/2003 |
| JP | 1476977 | | 2/2004 |
| JP | 2004174950 | | 6/2004 |
| JP | 2009083118 A | * | 4/2009 |
| JP | 2010158864 | | 7/2010 |

* cited by examiner

*Primary Examiner* — A. Dexter Tugbang
(74) *Attorney, Agent, or Firm* — Adams & Wilks

(57) ABSTRACT

In a method of manufacturing a liquid jet head, a laminated substrate is formed by bonding onto a base substrate piezoelectric substrates having side surfaces joined to each other. Discharge grooves serving as channels for discharging liquid and dummy grooves serving as dummy channels that do not discharge the liquid are formed on a surface of the laminated substrate. The discharge grooves and dummy grooves are alternately arranged relative one another and are parallel to a longitudinal direction of bonding surfaces formed by the joined side surfaces of the piezoelectric substrates. The dummy grooves are formed at the respective bonding surfaces. Drive electrodes are formed on side surfaces of the grooves.

18 Claims, 6 Drawing Sheets

METHOD OF MANUFACTURING A LIQUID JET HEAD

BACKGROUND OF THE INVENTION

1. Field of the Invention

The present invention relates to a method of manufacturing a liquid jet head for discharging liquid onto a recording medium to perform recording.

2. Description of the Related Art

In recent years, an inkjet system liquid jet head has been used for creating characters and graphics by discharging ink droplets onto a recording sheet or the like, or forming a functional thin film by discharging a liquid material onto a surface of an element substrate. In the inkjet system, ink or a liquid material is supplied from a liquid tank to the liquid jet head through a supply tube, and the ink or the liquid material loaded into channels is discharged from nozzles communicating to the channels. When discharging the ink, the liquid jet head and the recording medium, onto which a pattern of the jetted liquid is to be recorded, are moved to record characters and graphics, or to form a functional thin film having a predetermined shape.

As this type of liquid jet head, a system utilizing a thickness shear mode of a piezoelectric body has been put into practical use. Nowadays, line elongation of this type of liquid jet head has been discussed. In general, a piezoelectric member for the thickness shear mode has a maximum length of 100 mm to 140 mm, and it is difficult to form a piezoelectric member having a larger size. Therefore, it is conceived that a plurality of piezoelectric members are connected so as to achieve the line elongation of the liquid jet head.

Japanese Patent Application Laid-open No. Hei 9-48132 describes an upsized ink jet printer, which is obtained by connecting piezoelectric members to elongate the entire piezoelectric member in a direction of a printing width. FIGS. 7A, 7B, and 7C illustrate an upsized piezoelectric member described in Japanese Patent Application Laid-open No. Hei 9-48132 (FIGS. 6A, 6B, and 6C of Japanese Patent Application Laid-open No. Hei 9-48132). FIG. 7A is a plan view, FIG. 7B is a sectional view, and FIG. 7C is an enlarged sectional view of an adhesive layer portion 104. A piezoelectric member 101a and a piezoelectric member 101b are adhered to each other by the adhesive layer portion 104. In a surface of an elongated piezoelectric member 101, grooves 102 and side walls 103 are formed. The grooves 102 and the side walls 103 are formed so that one of the grooves 102 is situated above the adhesive layer portion 104.

FIGS. 8A, 8B, 8C, 8D, and 8E illustrate another example of the elongated piezoelectric member described in Japanese Patent Application Laid-open No. Hei 9-48132 (FIGS. 2A, 2B, 2C, 2D, and 2E of Japanese Patent Application Laid-open No. Hei 9-48132). As illustrated in a top view of FIG. 8E, an adhesive layer portion 120 intersects, at an angle $\theta_1$, a width direction in which grooves 112 and side walls 113 are arranged. FIGS. 8A to 8D illustrate a method of obtaining an elongated piezoelectric body portion illustrated in FIG. 8E. Specifically, as illustrated in FIG. 8A, side surfaces of piezoelectric members A1 and A2 are adhered to each other with a shift of a length y4 in a groove direction. Subsequently, as illustrated in FIG. 8B, peripheral hatched portions of an elongated piezoelectric member A3 indicated by the dotted line are cut off. Accordingly, as illustrated in FIG. 8C, the adhesive layer portion 120 is inclined at the angle $\theta_1$ from a longitudinal direction of the elongated piezoelectric member A3. A large number of grooves are formed so as to intersect the broken line of the elongated piezoelectric member A3, and the elongated piezoelectric member A3 is cut along the broken line at the center. Accordingly, as illustrated in FIG. 8D, such an elongated piezoelectric member is obtained that the grooves 112 and the side walls 113 are formed over a range from a piezoelectric member 110a to a piezoelectric member 110b.

In the piezoelectric member 101 illustrated in FIGS. 7A, 7B, and 7C, the piezoelectric member 101a and the piezoelectric member 101b are connected to each other by the adhesive layer portion 104. The piezoelectric member 101 has a width of 200 mm to 300 mm, and has a plate thickness of 0.5 mm to 5 mm. Therefore, it is extremely difficult to adhere end surfaces of the piezoelectric member 101a and the piezoelectric member 101b to each other. Further, due to the adhesion of the end surfaces that are small in plate thickness, the strength of the adhesive layer portion 104 is low, and it is extremely difficult to deal with electrode formation, electrode terminal connection, and the like.

Further, in the elongated piezoelectric member A3 illustrated in FIGS. 8A, 8B, 8C, 8D, and 8E, the adhesive layer portion 120 intersects the side walls 113 constituting a drive unit, and hence fluctuations in mechanical characteristics and electrical characteristics occur between the side walls 113 in which the adhesive layer portion 120 is not formed and the side walls 113 in which the adhesive layer portion 120 is formed. As a result, uniformity in ink discharge characteristics is impaired. Further, bubbles are likely to remain inside the adhesive layer portion 120, which may potentially cause leakage of ink from the bubbles.

SUMMARY OF THE INVENTION

The present invention has been made in view of the problems described above, and may therefore provide a liquid jet head, in which no adhesive surface is left in the elongated piezoelectric member, to thereby reduce the fluctuations in mechanical characteristics and electrical characteristics of the piezoelectric member.

According to an exemplary embodiment of the present invention, there is provided a method of manufacturing a liquid jet head, the method including: a laminated substrate forming step of forming a laminated substrate by bonding a plurality of piezoelectric substrates, which are made of a high dielectric material and have side surfaces joined to each other, onto a base substrate made of a low dielectric material; a groove forming step of forming, in a top surface of the laminated substrate, a plurality of grooves having a depth reaching to the base substrate and arranged in parallel to a longitudinal direction of the joined side surfaces of the plurality of piezoelectric substrates, and removing the joined side surfaces when the plurality of grooves are formed; an electrode forming step of forming drive electrodes on side surfaces of the plurality of grooves; a cover plate bonding step of bonding a cover plate to the laminated substrate so as to cover the plurality of grooves; and a nozzle plate bonding step of bonding a nozzle plate to the laminated substrate.

In addition, the method of manufacturing a liquid jet head further includes a planarization step of planarizing surfaces of the plurality of piezoelectric substrates, the planarization step succeeding the laminated substrate forming step.

In addition, the electrode forming step includes: a pattern forming step of forming a pattern made of a resin film on the surfaces of the plurality of piezoelectric substrates, the pattern forming step preceding the groove forming step; an electrode material depositing step of depositing an electrode material on the top surface of the laminated substrate, the electrode material depositing step succeeding the groove forming step; and a resin film removing step of removing the resin film, the resin film removing step succeeding the groove forming step.

In addition, the method of manufacturing a liquid jet head further includes a nozzle forming step of forming nozzles communicating to the plurality of grooves in the nozzle plate, the nozzle forming step succeeding the nozzle plate bonding step.

In addition, the electrode forming step includes forming extension electrodes, which are electrically connected to the drive electrodes, on the surfaces of the plurality of piezoelectric substrates, and the method further includes a flexible substrate mounting step of bonding a flexible substrate having wiring electrodes formed thereon to an upper portion of the extension electrodes, and electrically connecting the extension electrodes and the wiring electrodes to each other, the flexible substrate mounting step succeeding the electrode forming step.

In addition, the groove forming step includes alternately forming a discharge groove constituting a channel for discharging liquid and a dummy groove constituting a dummy channel that does not discharge the liquid, the dummy groove being formed to have the depth reaching to the base substrate over a range from one end portion of the laminated substrate to another end portion opposed to the one end portion, and removing the joined side surfaces of the plurality of piezoelectric substrates.

In addition, the groove forming step includes forming the plurality of grooves over a range from one end portion of the laminated substrate to another end portion opposed to the one end portion.

According to the exemplary embodiment of the present invention, there is provided the method of manufacturing a liquid jet head, the method including: the laminated substrate forming step of forming the laminated substrate by bonding the plurality of piezoelectric substrates, which are made of a high dielectric material and have the side surfaces joined to each other, onto the base substrate made of a low dielectric material; the groove forming step of forming, in the top surface of the laminated substrate, the plurality of grooves having the depth reaching to the base substrate and arranged in parallel to the longitudinal direction of the joined side surfaces of the plurality of piezoelectric substrates, and removing the joined side surfaces when the plurality of grooves are formed; the electrode forming step of forming the drive electrodes on the side surfaces of the plurality of grooves; the cover plate bonding step of bonding the cover plate to the laminated substrate so as to cover the plurality of grooves; and the nozzle plate bonding step of bonding the nozzle plate to the laminated substrate.

The elongated piezoelectric substrate obtained by joining the side surfaces of the plurality of piezoelectric substrates is bonded onto the base substrate, and accordingly the strength of the elongated piezoelectric substrate can be ensured. Further, the joined and bonded side surfaces are removed from the elongated piezoelectric substrate. Accordingly, liquid is prevented from leaking from the bonding surface between the plurality of piezoelectric substrates, and the fluctuations in mechanical characteristics and electrical characteristics of partition walls, which may be caused by the bonding surface contained in the partition walls, are prevented.

DETAILED DESCRIPTION OF THE PREFERRED EMBODIMENTS

Figure 1:
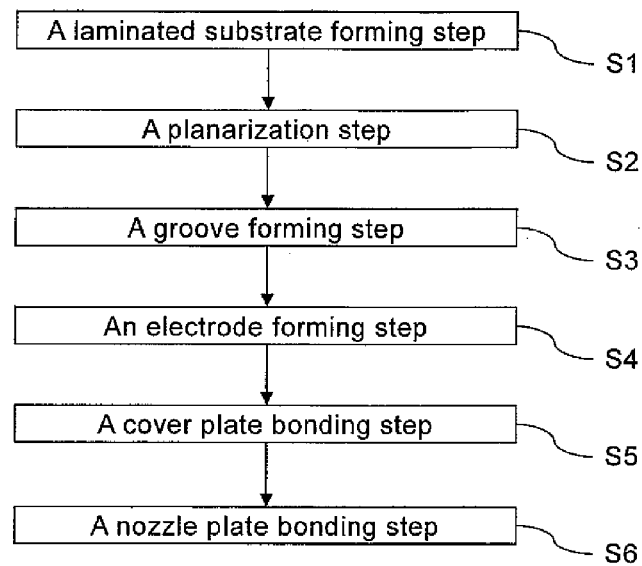
FIG. 1 is a flow chart illustrating a method of manufacturing a liquid jet head according to the present invention.

FIG. 1 is a flow chart illustrating a method of manufacturing a liquid jet head according to the present invention. As illustrated in FIG. 1, the method of manufacturing a liquid jet head according to the present invention includes a laminated substrate forming step S1, a planarization step S2, a groove forming step S3, an electrode forming step S4, a cover plate bonding step S5, and a nozzle plate bonding step S6.

In the laminated substrate forming step S1, side surfaces of a plurality of piezoelectric substrates made of a high dielectric material are joined to each other and the resultant piezoelectric substrate is bonded onto a base substrate made of a low dielectric material. An adhesive is interposed between the base substrate and the piezoelectric substrate so that the piezoelectric substrate is bonded to the base substrate. An adhesive is interposed also between the side surfaces of the plurality of piezoelectric substrates. As the piezoelectric substrate, piezoelectric ceramics such as lead zilconate titanate (PZT) and barium titanate ($BaTiO_3$) may be used. As the low dielectric material, a glass substrate or a ceramic substrate made of an oxide or a nitride may be used.

In the planarization step S2, a surface of the piezoelectric substrate is grounded or polished for planarization. Accordingly, the piezoelectric substrate is formed to have a uniform thickness. In the groove forming step S3, a plurality of grooves having a depth reaching to the base substrate and arranged in parallel to a longitudinal direction of the joined side surfaces of the plurality of piezoelectric substrates are formed in a top surface of the laminated substrate, and the joined side surfaces are cut off and removed when the grooves are formed. Accordingly, the side surfaces bonded in order to elongate the piezoelectric substrate are removed from the laminated substrate, and hence the side surfaces are not contained in each partition wall situated between the grooves. Further, the base substrate made of the low dielectric material is exposed at bottom surfaces of the grooves. Specifically, a piezoelectric material having a high dielectric constant is not interposed between the adjacent partition walls, and hence capacitive coupling between the partition walls is suppressed. As a result, a phenomenon that a drive signal for driving one partition wall leaks to another partition wall to affect the drive of the another partition wall, that is, leakage of the drive signal, can be reduced. The grooves are formed by using a dicing blade or a dicing saw having abrasive grains, such as diamond, embedded into an outer peripheral portion thereof.

It is noted that the surface of the piezoelectric substrate obtained by joining the side surfaces of the plurality of piezoelectric substrates is sufficiently planar, the planarization step 52 may be omitted.

In the electrode forming step S4, drive electrodes are formed on side surfaces of the grooves, that is, side surfaces of the partition walls that separate the grooves. The drive electrodes may be formed by depositing a metal material by a sputtering method, a deposition method, or a plating method. As the electrode forming step S4, for example, a lift-off method may be used. Specifically, the lift-off method may include, before the groove forming step S3, a pattern forming step of forming a pattern made of a resin film on the planar surface formed in the planarization step S2, and include, after the groove forming step S3, an electrode material depositing step of depositing an electrode material on the top surface of the laminated substrate and a resin film removing step of removing the resin film. A photosensitive resin may be used for the resin film to form the pattern by photolithography. Further, in the electrode material depositing step, the metal material may be deposited by an oblique deposition method to form the drive electrodes on a substantially upper half of the side surfaces of the partition walls.

In the cover plate bonding step S5, a cover plate is bonded so as to cover the plurality of grooves of the laminated substrate. The cover plate includes a liquid supply cell for supplying liquid to the respective grooves. In the nozzle plate bonding step S6, a nozzle plate is bonded to an end surface of the laminated substrate at which the grooves are opened. Nozzles to be formed in the nozzle plate may be formed before the nozzle plate is bonded to the end surface of the laminated substrate. Further, after the nozzle plate bonding step, there may be provided a nozzle forming step of forming the nozzles communicating to the grooves in the nozzle plate. The nozzles are preferred to be opened after the nozzle plate is bonded because the nozzles can be formed with high positional accuracy.

In this manner, the plurality of piezoelectric substrates having the joined side surfaces are bonded onto the base substrate, and hence the strength of the elongated piezoelectric substrate can be ensured. Further, the joined and bonded side surfaces are completely removed from the elongated piezoelectric substrate, and hence liquid does not leak from the bonding surface between the plurality of piezoelectric substrates. Further, the bonding surface is not contained in the partition walls, and hence fluctuations in mechanical or electrical drive characteristics of the partition walls are reduced, with the result that liquid discharge characteristics can be controlled uniformly. Hereinafter, the present invention is specifically described with reference to the accompanying drawings.

First Embodiment

Figure 2:
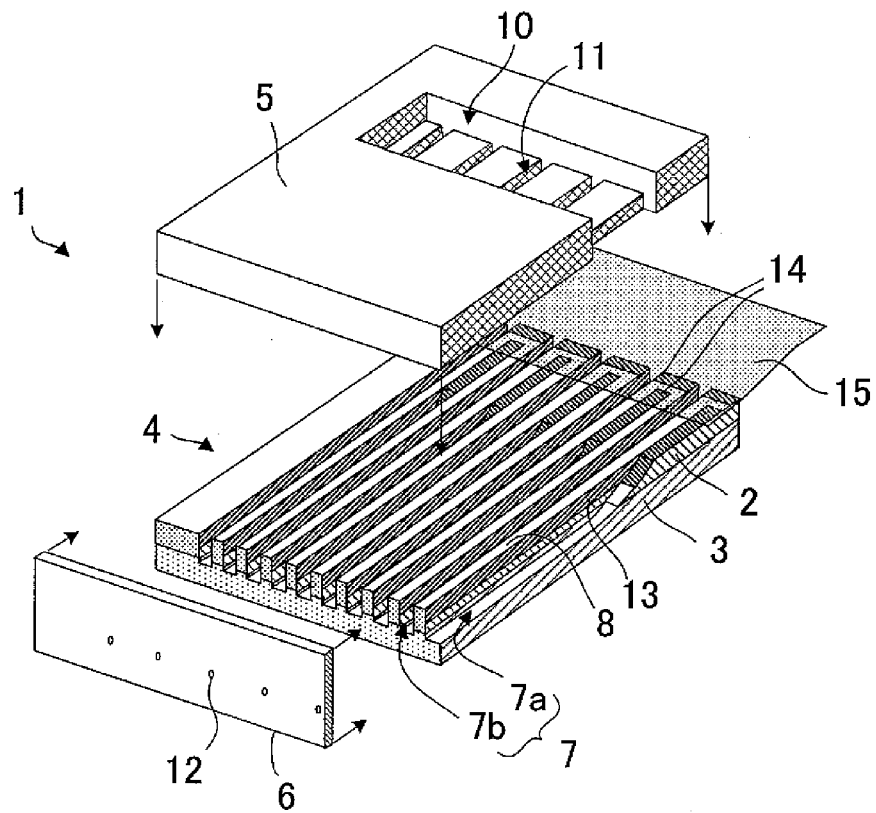
FIG. 2 is an exploded perspective view of a liquid jet head manufactured by a method of manufacturing a liquid jet head according to a first embodiment of the present invention.

FIG. 2 is an exploded perspective view of a liquid jet head 1 formed by a method of manufacturing a liquid jet head 1 according to a first embodiment of the present invention. FIGS. 3A to 5N are explanatory views illustrating the method of manufacturing a liquid jet head 1 according to the first embodiment.

As illustrated in FIG. 2, the liquid jet head 1 includes a laminated substrate 4 having a plurality of grooves 7 formed therein, a cover plate 5 bonded to a top surface of the laminated substrate 4, and a nozzle plate 6 bonded to an end surface of the laminated substrate 4 at which the plurality of grooves 7 are opened. The laminated substrate 4 is formed of a base substrate 3 and a piezoelectric substrate 2 adhered onto the base substrate 3. The plurality of grooves 7 include discharge grooves 7a constituting channels for discharging liquid, and dummy grooves 7b constituting dummy channels that do not discharge the liquid. The discharge grooves 7a and the dummy grooves 7b are alternately arranged in parallel to each other. The discharge grooves 7a are formed in a range from a front end of the laminated substrate 4 to a position short of a rear end thereof, and the dummy grooves 7b are formed in a range from the front end of the laminated substrate 4 to the rear end thereof. Partition walls 8 each separate the adjacent grooves 7, and have drive electrodes 13 formed on side surfaces thereof. Extension electrodes 14 electrically connected to the drive electrodes 13 are formed on part of the top surface of the laminated substrate 4 in the vicinity of the rear end thereof. The cover plate 5 includes a liquid supply cell 10 at a position short of a rear end thereof. The liquid supply cell 10 have slits 11 formed therein, and the liquid is supplied to the respective discharge grooves 7a through the slits 11. The nozzle plate 6 includes nozzles 12 at positions corresponding to the discharge grooves 7a. A flexible substrate 15 is bonded to part of the top surface of the laminated substrate 4 at the rear end thereof.

A control unit (not shown) supplies a drive signal to the drive electrodes 13 through the flexible substrate 15 and the extension electrodes 14 to deform the partition walls 8 surrounding the discharge grooves 7a. Accordingly, the liquid loaded into the discharge grooves 7a is discharged from the nozzles 12 so that recording is performed on a recording medium (not shown).

Figure 3A:
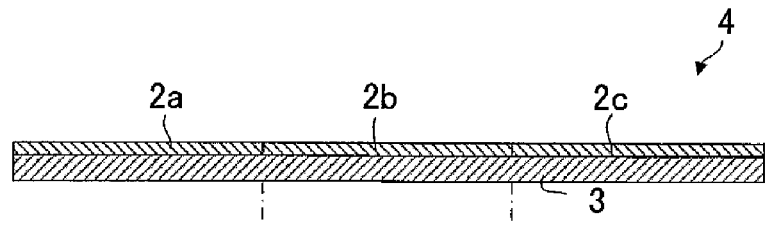
FIGS. 3A, 3B, 3C, 3D, 3E, and 3F are explanatory views illustrating the method of manufacturing a liquid jet head according to the first embodiment of the present invention.

Referring to FIGS. 3A to 4K, the above-mentioned method of manufacturing a liquid jet head 1 is described. FIG. 3A is a schematic vertical sectional view of the laminated substrate 4 after the laminated substrate forming step S1. Three piezoelectric substrates 2a, 2b, and 2c are bonded to a top surface of the base substrate 3 with an adhesive. Adhesives are interposed also between side surfaces of the piezoelectric substrates 2a and 2b, and between side surfaces of the piezoelectric substrates 2b and 2c. At the time of bonding, the side surfaces of the piezoelectric substrates 2a and 2b, and the side surfaces of the piezoelectric substrates 2b and 2c are joined to each other, respectively. Then, the laminated substrate 4 is introduced into a vacuum chamber, in which a vacuum is generated so that adhesion is performed while degassing the laminated substrate 4. Bonding surfaces BL formed by joining the side surfaces of the piezoelectric substrates 2a and 2b, and the side surfaces of the piezoelectric substrates 2b and 2c are smaller in width than the grooves 7 to be formed later. The side surfaces of the respective piezoelectric substrates 2a, 2b, and 2c are planarized into a dimension equal to or smaller than at least half the width of the dummy groove 7b. As the piezoelectric substrate 2, there is used PZT subjected to polarization processing in a direction perpendicular to a plate surface. As the base substrate 3, there may be used a low dielectric material having a dielectric constant smaller by at least two orders of magnitude than the piezoelectric material such as PZT, for example, a glass substrate or a ceramic substrate made of an oxide or a nitride.

Figure 3B:
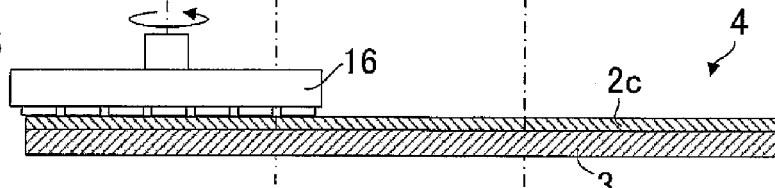

FIG. 3B is a schematic sectional view illustrating the planarization step S2. The respective piezoelectric substrates 2a, 2b, and 2c are adhered onto the base substrate 3, and hence the laminated substrate 4 has strength enough to withstand the planarization step S2. A grinding machine 16 having grinding wheels attached thereto are brought into abutment against top surfaces of the piezoelectric substrates 2a, 2b, and 2c, and the grinding machine 16 is rotated so that the piezoelectric substrates 2a, 2b, and 2c are grounded into a planar shape and a uniform thickness. Further, a polishing machine may be used in place of the grinding machine 16 so that the surface of the laminated substrate 4 is polished for planarization while supplying abrasive grains.

Figure 3C:
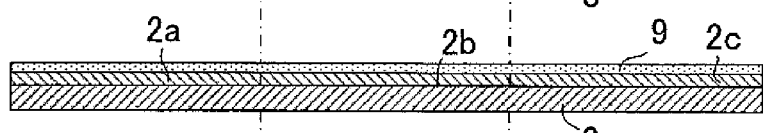

FIG. 3C is a schematic sectional view of the laminated substrate 4 after the pattern forming step. A pattern made of a resin film 9 is formed on the planar surface of the laminated substrate 4. A photosensitive resin film is formed as the resin film on the planar surface of the laminated substrate 4 to form the pattern by photolithography. The pattern of the resin film 9 is used for forming the extension electrodes to be described later by a lift-off method. The resin film is removed from a region in which an electrode material is to be left, and the resin film is left in a region from which the electrode material is to be removed.

Figure 3D:
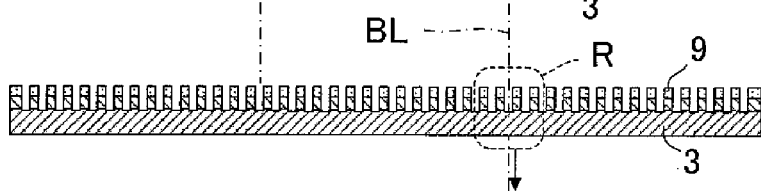
Figure 3E:
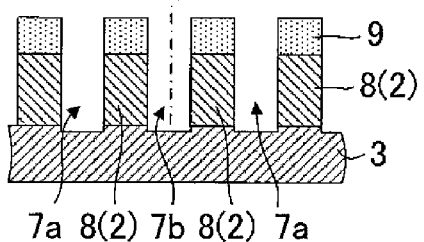
Figure 3F:
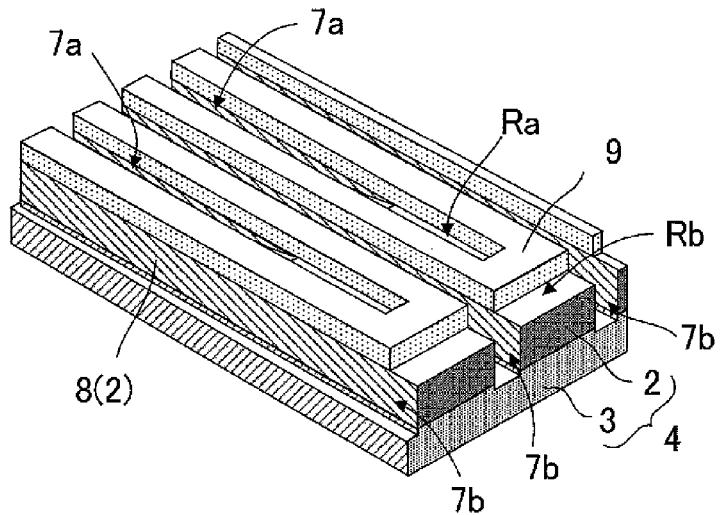

FIG. 3D is a schematic sectional view of the laminated substrate 4 after the groove forming step S3. FIG. 3E is an enlarged view of a part surrounded by the broken line R. FIG. 3F is a schematic partial perspective view of the region indicated by the broken line R when a rear side thereof is obliquely viewed from above. The plurality of grooves 7a and 7b having a depth reaching to the base substrate 3 are formed by using a dicing blade or a dicing saw. It is preferred that a depth of cut in the base substrate 3 be 10 μm in consideration of processing accuracy. The plurality of grooves 7a and 7b are formed so as to be arranged in parallel to a longitudinal direction of the bonding surfaces BL formed by joining the side surfaces of the piezoelectric substrates 2a and 2b, and the side surfaces of the piezoelectric substrates 2b and 2c. The discharge grooves 7a constitute the channels for discharging liquid, and the dummy grooves 7b constitute the dummy channels that do not discharge the liquid. The discharge grooves 7a and the dummy grooves 7b are alternately arranged.

In this case, as illustrated in FIG. 3E, the plurality of discharge grooves 7a and dummy grooves 7b are formed so that the bonding surfaces BL are contained in the dummy grooves 7b. Further, as illustrated in FIG. 3F, the dummy grooves 7b are formed straight over a range from the front end of the laminated substrate 4 to the rear end thereof, and the discharge grooves 7a are formed in a range from the front end to the position short of the rear end. Thus, the bonding surfaces BL are completely removed from the laminated substrate 4, and the discharge grooves 7a, the dummy grooves 7b, and the partition walls 8 that separate the discharge grooves 7a and the dummy grooves 7b can be formed uniformly irrespective of the formation positions thereof. It is noted that the widths of the respective piezoelectric substrates 2a, 2b, and 2c are set in advance so that all the bonding surfaces BL are contained in the dummy grooves 7b. Specifically, the widths of all the piezoelectric substrate 2a, 2b, and 2c are set to an integral multiple of intervals of the dummy grooves 7b. As illustrated in FIG. 3F, the resin film 9 is removed from a region of a top surface Rb of the laminated substrate 4 in the vicinity of the rear end thereof and a region of a top surface Ra of the laminated substrate 4 on a rear side of the discharge grooves 7a. This is because extension electrodes 14a and 14b (see FIG. 4J) are formed later by the lift-off method, in which the electrode material is deposited and the resin film 9 is removed.

Figure 4A:
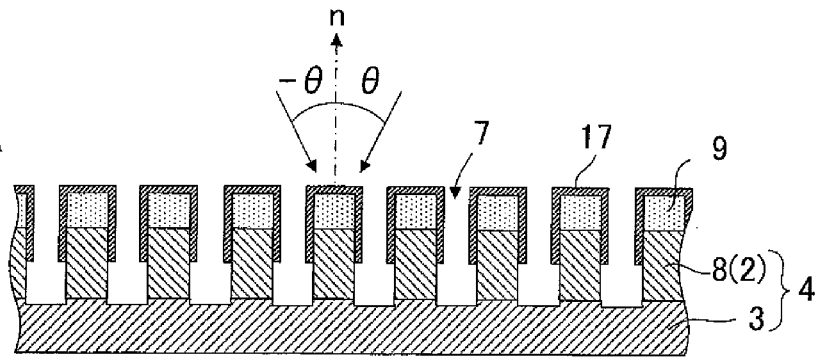
FIGS. 4A, 4B, 4C, 4D, and 4E are explanatory views illustrating the method of manufacturing a liquid jet head according to the first embodiment of the present invention.
Figure 4B:
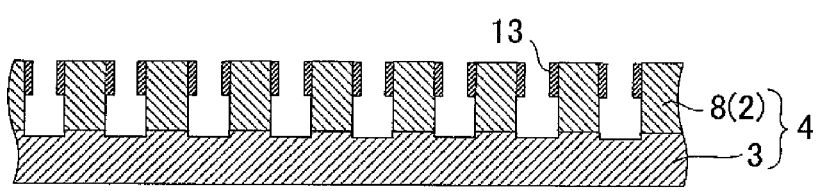

FIGS. 4A and 4B are schematic sectional views of the laminated substrate 4, illustrating the electrode forming step S4. FIG. 4A illustrates the electrode material depositing step. The electrode material is deposited from a direction of an inclination angle θ, which is substantially orthogonal to a direction of the grooves 7 on the upper side of the laminated substrate 4 and inclined from a normal n of top surfaces of the partition walls 8. Then, the electrode material is deposited from a direction of an inclination angle −θ. Accordingly, an electrode material 17 can be deposited on the top surface of the laminated substrate 4 and part of the side surfaces of the partition walls 8 above substantially half the height thereof.

FIG. 4B is a schematic sectional view of the laminated substrate 4 after the resin film removing step, in which the resin film 9 is removed from the laminated substrate 4. The resin film 9 is removed, and accordingly the electrode material 17 on the resin film 9 is removed. Thus, the drive electrodes 13 are formed on part of the respective partition walls 8 above substantially half the height thereof. Further, the extension electrodes 14a and 14b (see FIGS. 4D to 5C) are formed in the regions of the top surfaces Ra and Rb of the laminated substrate 4 at the rear end thereof.

Figure 4C:
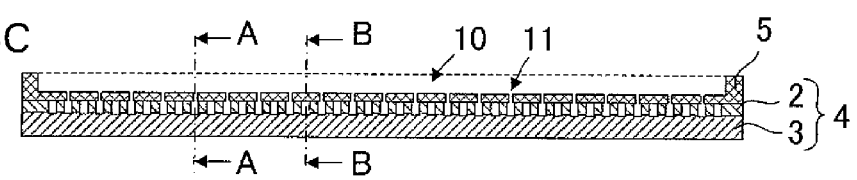
Figure 4D:
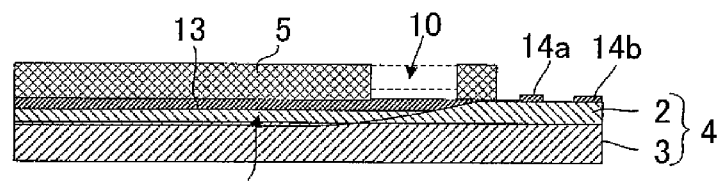
Figure 4E:
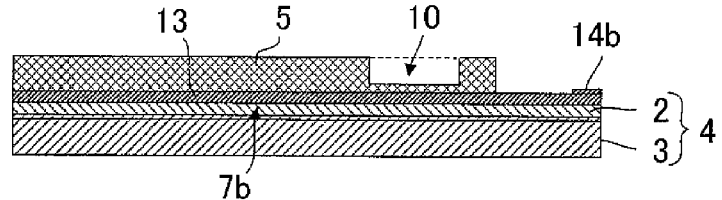

FIG. 4C is a schematic sectional view after the cover plate bonding step S5. The cover plate 5 is bonded to the laminated substrate 4 so as to cover the plurality of grooves 7. The discharge grooves 7a communicate to the liquid supply cell 10 through the slits 11, respectively. FIG. 4D is a vertical sectional view of the part AA, illustrating the discharge groove 7a in a longitudinal direction thereof, and FIG. 4E is a vertical sectional view of the part BB, illustrating the dummy groove 7b in a longitudinal direction thereof. As illustrated in FIG. 4D, the discharge groove 7a is opened at the end surface of the laminated substrate 4 at the front end thereof, and is closed at the position short of the rear end thereof to communicate to the liquid supply cell 10. As illustrated in FIG. 4E, each dummy groove 7b is formed straight over a range from the front end to the rear end, and does not communicate to the liquid supply cell 10. Further, the extension electrode 14a electrically connected to the drive electrodes 13 formed on the side surfaces of the discharge groove 7a, and the extension electrode 14b electrically connected to the drive electrodes 13 formed on the side surfaces of the dummy groove 7b are formed at the part of the top surface of the laminated substrate 4 at the rear end thereof.

Figure 5A:
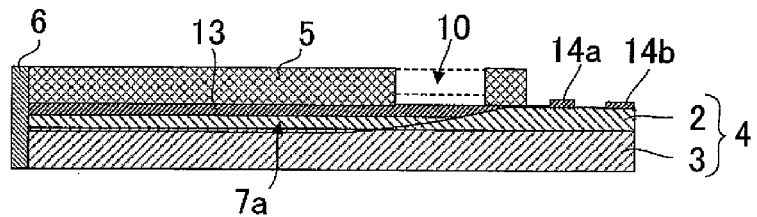
FIGS. 5A, 5B, and 5C are explanatory views illustrating the method of manufacturing a liquid jet head according to the first embodiment of the present invention.
Figure 5B:
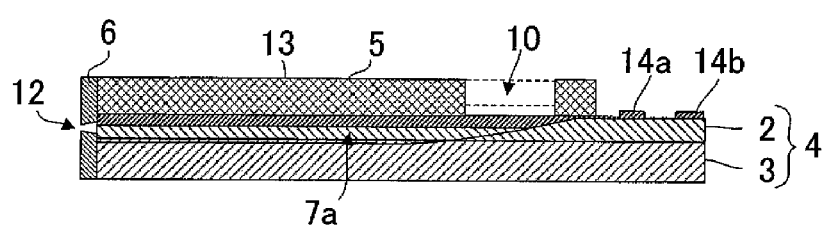

FIG. 5A is a schematic sectional view after the nozzle plate bonding step S6. The nozzle plate 6 having no nozzles 12 provided therein is bonded to the front ends of the laminated substrate 4 and the cover plate 5 with an adhesive. FIG. 5B is a schematic sectional view after the nozzle forming step. The nozzles 12 are formed from outside in the nozzle plate 6 bonded to the front end of the laminated substrate 4. The nozzles 12 are formed by a reverse tapering process, in which the diameter is increased in a depth direction by using a laser beam. A synthetic resin film such as a polyimide film may be used for the nozzle plate 6. The polyimide film has a coefficient of thermal expansion larger by at least one order of magnitude than the piezoelectric material such as PZT. Further, the polyimide film has a high hygroscopic property, and hence greatly expands and contracts along with moisture absorption and drying. Therefore, it is extremely difficult to form the nozzles 12 in advance in an elongated object having a dimension of 200 mm or more with an accuracy of several tens of microns or less. Therefore, as in this embodiment, the nozzle plate 6 is bonded to the laminated substrate 4, and then the nozzles 12 are opened with their positions aligned with the positions of the respective discharge grooves 7a. Accordingly, the nozzles 12 can be formed with high positional accuracy.

Figure 5C:
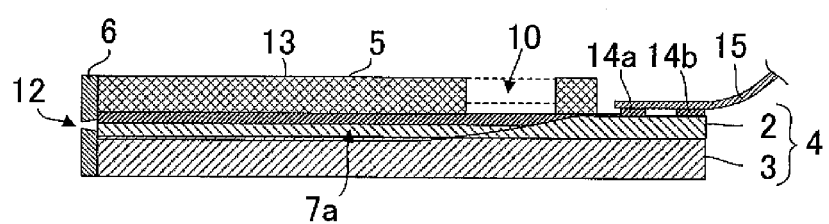

FIG. 5C is a schematic sectional view after a flexible substrate mounting step. The flexible substrate 15 is bonded to part of the top surface of the laminated substrate 4 at the rear end thereof. The extension electrodes 14a and 14b formed on the top surface of the laminated substrate 4 are electrically connected to wiring electrodes (not shown) formed on the flexible substrate 15. Accordingly, the drive signal can be supplied from the control unit (not shown) to the drive electrodes 13.

As described above, the elongated piezoelectric substrate is laminated on the base substrate, and accordingly strength enough to withstand the subsequent steps is imparted. Further, the bonding surfaces formed by bonding the plurality of piezoelectric substrates are completely removed from the elongated piezoelectric substrate. Accordingly, liquid does not leak from the bonding surfaces, and the fluctuations in mechanical characteristics and electrical characteristics of the partition walls, which may be caused by the bonding surfaces contained in the partition walls, do not occur. Further, the respective grooves are formed to have a depth reaching to the base substrate, and hence the fluctuations in discharge characteristics, which may be caused by the leakage of the drive signal to the adjacent partition wall, can be reduced.

It is noted that in this embodiment, the discharge grooves 7a are formed to have a depth reaching to the base substrate made of a low dielectric material similarly to the dummy grooves 7b, but the piezoelectric substrate may be left at the bottom portions of the discharge grooves 7a. The bonding surfaces BL are not contained in the width of the discharge grooves 7a, and further, potentials supplied to the electrodes formed on the wall surfaces of both the partition walls of each discharge groove 7a are equal to each other. Accordingly, the above-mentioned actions and effects of the present invention can be produced even when the piezoelectric substrate is left at the bottom portions of the discharge grooves 7a. Further, in this embodiment, the extension electrode 14a is formed in the region of the top surface Ra of the laminated substrate 4, and the extension electrode 14b is formed in the region of the top surface Rb of the laminated substrate 4 so as to electrically connect the two drive electrodes 13 formed on the adjacent dummy grooves 7b, but the present invention is not limited to this structure. The two drive electrodes 13 may be connected by the wiring electrode of the flexible substrate 15 without connecting the two drive electrodes 13 of the two adjacent dummy grooves 7b by the extension electrode 14b. Further, in this embodiment, the base substrate 3 is exposed with a small depth of cut in the groove forming step S3, but the present invention is not limited thereto. The base substrate 3 may be cut with a larger depth approximately corresponding to the thickness of the piezoelectric substrate 2. In this case, the partition walls of the base substrate 3 are displaced along with displacement of the partition walls of the piezoelectric substrate 2, and accordingly the liquid loaded inside can be discharged from the nozzles.

Second Embodiment

Figure 6:
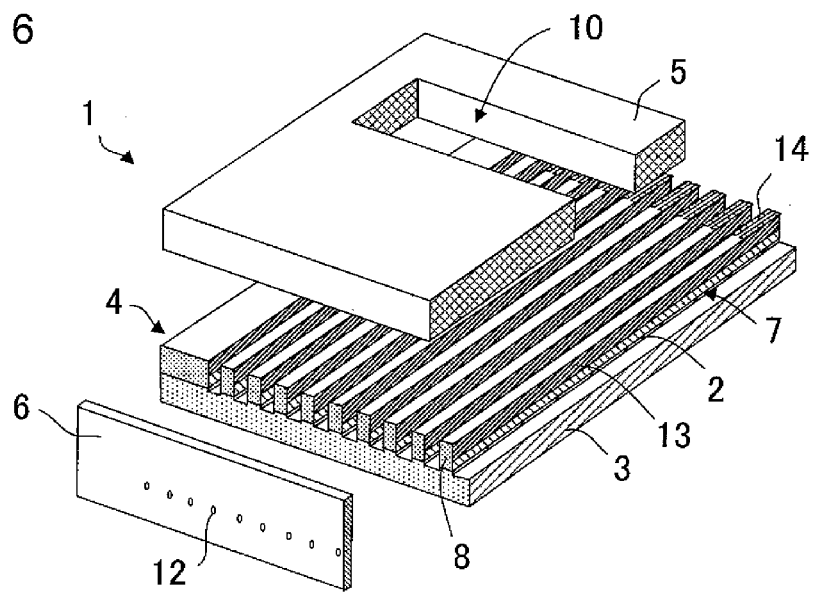
FIG. 6 is an exploded perspective view of a liquid jet head manufactured by a method of manufacturing a liquid jet head according to a second embodiment of the present invention.
Figure 7A:
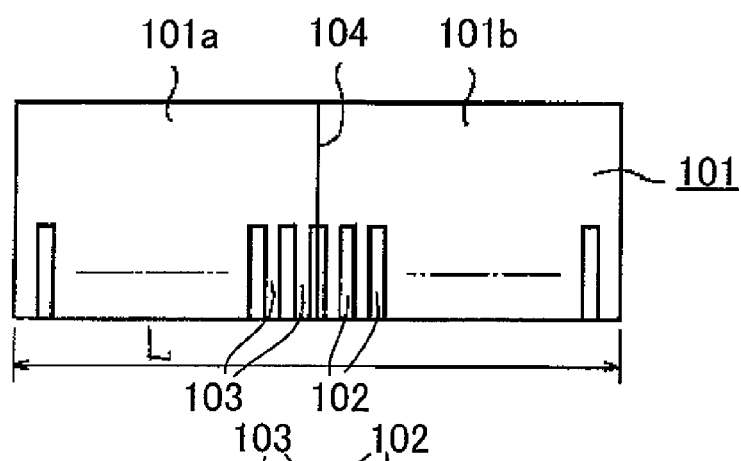
FIGS. 7A, 7B, and 7C are explanatory views illustrating a conventionally known ink jet printer.
Figure 7B:
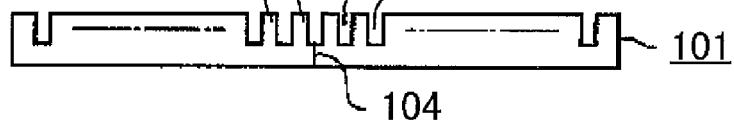
Figure 7C:
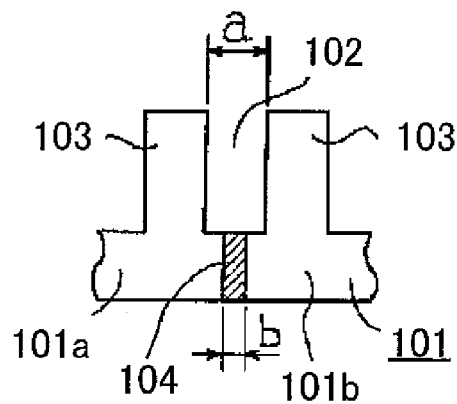
Figure 8A:
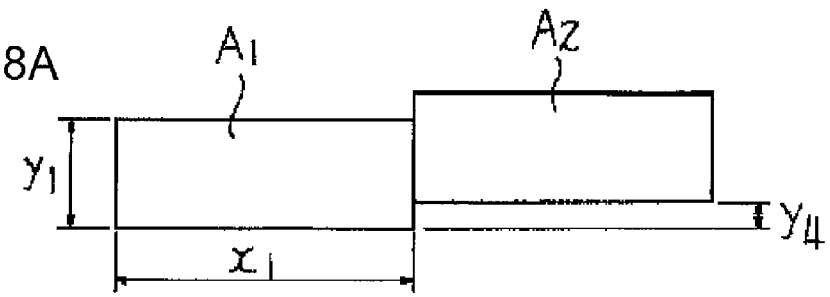
FIGS. 8A, 8B, 8C, 8D, and 8E are explanatory views illustrating the conventionally known ink jet printer.
Figure 8B:
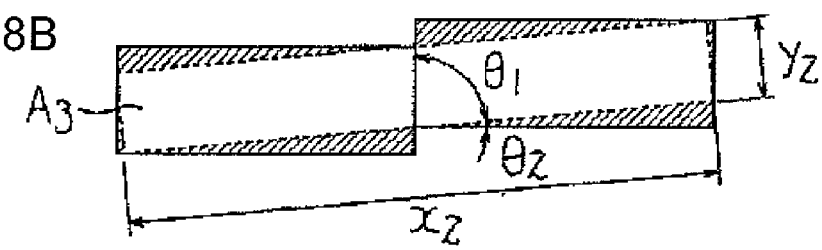
Figure 8C:
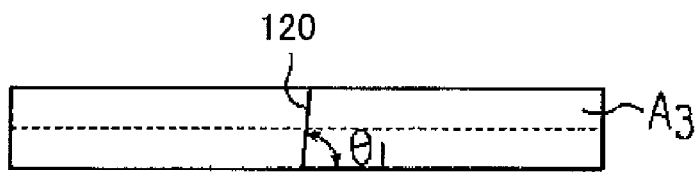
Figure 8D:
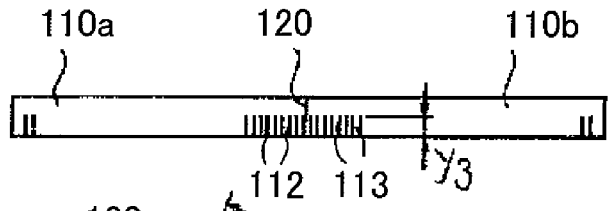
Figure 8E:
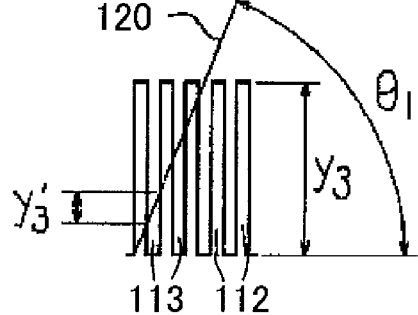

FIG. 6 is an exploded perspective view of a liquid jet head 1 formed by a method of manufacturing a liquid jet head 1 according to a second embodiment of the present invention. The same components or components having the same functions as those in the first embodiment are denoted by the same reference symbols.

As illustrated in FIG. 6, the liquid jet head 1 includes a laminated substrate 4 having a plurality of grooves 7 formed therein, a cover plate 5 bonded to a top surface of the laminated substrate 4, and a nozzle plate 6 bonded to an end surface of the laminated substrate 4 at which the plurality of grooves 7 are opened. The laminated substrate 4 is formed of a base substrate 3 and a piezoelectric substrate 2 adhered onto the base substrate 3. The plurality of grooves 7 have a depth reaching to the base substrate 3 over a range from the front end of the laminated substrate 4 to the rear end thereof. Partition walls B are each provided between the adjacent grooves 7, and drive electrodes 13 are provided on side surfaces thereof. Extension electrodes 14 electrically connected to the drive electrodes 13 are formed on part of the top surface of the laminated substrate 4 in the vicinity of the rear end thereof. The cover plate 5 includes a liquid supply cell 10 at a position short of a rear end thereof. The liquid supply cell 10 communicates to the respective grooves 7. The liquid jet head 1 according to this embodiment may be driven to discharge liquid through, for example, 3-cycle drive.

The method of manufacturing a liquid jet head 1 according to the second embodiment is different from that of the first embodiment in the groove forming step S3. The other steps of the manufacturing method according to the second embodiment are the same or substantially the same as those of the first embodiment. Therefore, the groove forming step S3 is described below.

The plurality of grooves 7 are formed in the top surface of the laminated substrate 4 by using a dicing blade or a dicing saw. The plurality of grooves 7 are formed so as to be arranged in parallel to a longitudinal direction of bonding surfaces BL formed by joining side surfaces of a plurality of piezoelectric substrates 2. At this time, all the grooves 7 are formed to have a depth reaching to the base substrate 3 in a range from the front end of the laminated substrate 4 to the rear end thereof. The widths of the plurality of piezoelectric substrates 2 are set in advance so that the bonding surfaces BL are each situated in a groove width of any one of the grooves 7, and the bonding surfaces BL are removed when the grooves 7 are formed. Accordingly, the strength of the elongated piezoelectric substrate can be ensured. Further, the joined and bonded side surfaces are removed from the elongated piezoelectric substrate, and hence liquid does not leak from each bonding surface between the plurality of piezoelectric substrates. Further, the bonding surfaces are not contained in the partition walls, and hence the fluctuations in mechanical characteristics and electrical characteristics of the partition walls can be reduced.

What is claimed is:

1. A method of manufacturing a liquid jet head, the method comprising:

providing a plurality of piezoelectric substrates each having an upper surface, a lower surface, and side surfaces, the plurality of piezoelectric substrates being made of a high dielectric material and including bonding surfaces formed by joining together the side surfaces of the piezoelectric substrates;

forming a laminated substrate by bonding the lower surfaces of the plurality of piezoelectric substrates onto a base substrate made of a low dielectric material;

forming, in a top surface of the laminated substrate formed by the upper surfaces of the plurality of piezoelectric substrates, a plurality of grooves having a depth reaching to the base substrate and arranged in parallel to the bonding surfaces of the plurality of piezoelectric substrates, the plurality of grooves being formed by alternately forming discharge grooves serving as channels for discharging liquid and dummy grooves serving as dummy channels that do not discharge the liquid, the dummy grooves being formed at the bonding surfaces of the laminated substrate;

removing the joined side surfaces of the plurality of piezoelectric substrates when the plurality of grooves are formed;

forming drive electrodes on side surfaces of the plurality of grooves;

bonding a cover plate to the laminated substrate so as to cover the plurality of grooves; and bonding a nozzle plate to the laminated substrate.

2. A method of manufacturing a liquid jet head according to claim 1, further comprising planarizing surfaces of the plurality of piezoelectric substrates, wherein the planarizing succeeds the forming of the laminated substrate.

3. A method of manufacturing a liquid jet head according to claim 1, wherein the forming drive electrodes comprises: forming a pattern made of a resin film on the surfaces of the plurality of piezoelectric substrates, wherein the forming a pattern precedes the forming of the plurality of grooves; depositing an electrode material on the top surface of the laminated substrate, wherein the depositing succeeds the forming of the plurality of grooves; and removing the resin film, wherein the removing of the resin film succeeds the forming of the plurality of grooves.

4. A method of manufacturing a liquid jet head according to claim 1, further comprising forming in the nozzle plate a plurality of nozzles communicating with the respective plurality of grooves, wherein the forming of the plurality of nozzles succeeds the bonding a of the nozzle plate.

5. A method of manufacturing a liquid jet head according to claim 1, wherein the forming of the drive electrodes comprises forming extension electrodes, which are electrically connected to the drive electrodes, on the surfaces of the plurality of piezoelectric substrates; and wherein the method further comprises mounting and bonding a flexible substrate having wiring electrodes formed thereon onto an upper portion of the extension electrodes, to thereby electrically connect the extension electrodes and the wiring electrodes to each other, wherein the mounting and bonding of the flexible substrate succeeds the forming of the drive electrodes.

6. A method of manufacturing a liquid jet head according to claim 1, wherein the dummy groove is formed so that the depth reaches the base substrate over a range from one end portion of the laminated substrate to another end portion opposed to the one end portion.

7. A method of manufacturing a liquid jet head according to claim 1, wherein the forming of the plurality of grooves comprises forming the plurality of grooves over a range from one end portion of the laminated substrate to another end portion opposed to the one end portion.

8. A method of manufacturing a liquid jet head, the method comprising:

providing a plurality of piezoelectric substrates each having an upper surface, a lower surface, and side surfaces, the plurality of piezoelectric substrates including bonding surfaces formed by joining together the side surfaces of the piezoelectric substrates;

forming a laminated substrate by bonding the lower surfaces of the plurality of piezoelectric substrates onto a base substrate;

forming, on a surface of the laminated substrate formed by the upper surfaces of the plurality of piezoelectric substrates, a plurality of alternately arranged discharge grooves and dummy grooves in parallel to a longitudinal direction of the bonding surfaces of the plurality of piezoelectric substrates, the plurality of discharge grooves serving as channels for discharging liquid, and the plurality of dummy grooves being formed at the respective bonding surfaces and serving as dummy channels that do not discharge the liquid; and forming drive electrodes on side surfaces of the plurality of grooves.

9. A method of manufacturing a liquid jet head according to claim 8, wherein the piezoelectric substrates are made of a high dielectric material and the base substrate is made of a low dielectric material.

10. A method of manufacturing a liquid jet head according to claim 8, further comprising removing the joined side surfaces of the plurality of piezoelectric substrates when the plurality of grooves are formed.

11. A method of manufacturing a liquid jet head according to claim 8, wherein the plurality of dummy grooves are formed to a depth reaching the base substrate over a range from one end portion of the laminated substrate to another end portion opposed to the one end portion.

12. A method of manufacturing a liquid jet head according to claim 8, further comprising planarizing surfaces of the plurality of piezoelectric substrates after the laminated substrate is formed.

13. A method of manufacturing a liquid jet head according to claim 8, wherein the drive electrodes are formed by forming a pattern made of a resin film on the surfaces of the plurality of piezoelectric substrates before the plurality of grooves are formed.

14. A method of manufacturing a liquid jet head according to claim 13, further comprising depositing an electrode material on the surface of the laminated substrate after the plurality of grooves are formed; and removing the resin film after the plurality of grooves are formed.

15. A method of manufacturing a liquid jet head according to claim 8, further comprising bonding a cover plate to the laminated substrate so as to cover the plurality of grooves; and bonding a nozzle plate to the laminated substrate.

16. A method of manufacturing a liquid jet head according to claim 15, further comprising forming in the nozzle plate a plurality of nozzles communicating with the respective plurality of grooves, the plurality of nozzles being formed after the nozzle plate is bonded to the laminated substrate.

17. A method of manufacturing a liquid jet head according to claim 8, wherein the drive electrodes are formed by forming extension electrodes on surfaces of the plurality of piezoelectric substrate; and further comprising mounting and bonding a flexible substrate having wiring electrodes formed thereon onto an upper portion of the extension electrodes to thereby electrically connect the extension electrodes and the wiring electrodes to each other.

18. A method of manufacturing a liquid jet head according to claim 8, wherein the plurality of grooves are formed over a range from one end portion of the laminated substrate to another end portion opposed to the one end portion.

* * * * *